(12) United States Patent
Kususe et al.

(10) Patent No.: US 9,293,674 B2
(45) Date of Patent: Mar. 22, 2016

(54) LIGHT EMITTING DEVICE INCLUDING LIGHT EMITTING ELEMENT, OUTER CONNECTION ELECTRODES AND RESIN LAYER

(71) Applicants: NICHIA CORPORATION, Anan-shi, Tokushima (JP); CITIZEN ELECTRONICS CO., LTD., Fujiyoshida-shi, Yamanashi (JP); CITIZEN HOLDINGS CO., LTD., Nishi-Tokyo-shi, Tokyo (JP)

(72) Inventors: Takeshi Kususe, Tokushima (JP); Toshiaki Ogawa, Anan (JP); Shunsuke Minato, Anan (JP); Nodoka Oyamada, Fujiyoshida (JP)

(73) Assignees: NICHIA CORPORATION, Anan-shi (JP); CITIZEN ELECTRONICS CO., LTD., Fujiyoshida-shi (JP); CITIZEN HOLDINGS CO., LTD., Nishi-Tokyo-Shi (JP)

( * ) Notice: Subject to any disclaimer, the term of this patent is extended or adjusted under 35 U.S.C. 154(b) by 0 days.

(21) Appl. No.: 14/176,375

(22) Filed: Feb. 10, 2014

(65) Prior Publication Data

US 2014/0225143 A1 Aug. 14, 2014

(30) Foreign Application Priority Data

Feb. 12, 2013 (JP) .................................. 2013-024746

(51) Int. Cl.
| | |
|---|---|
| *H01L 33/62* | (2010.01) |
| *H01L 33/50* | (2010.01) |
| *H01L 33/38* | (2010.01) |
| *H01L 33/54* | (2010.01) |
| *H01L 23/00* | (2006.01) |

(Continued)

(52) U.S. Cl.
CPC ................ *H01L 33/62* (2013.01); *H01L 24/96* (2013.01); *H01L 33/38* (2013.01); *H01L 33/505* (2013.01);
(Continued)

(58) Field of Classification Search
CPC ......... H01L 33/62; H01L 33/50; H01L 33/54; H01L 33/46; H01L 33/38; H01L 33/382; H01L 33/505
USPC ...................................................... 257/98, 99
See application file for complete search history.

(56) References Cited

U.S. PATENT DOCUMENTS

| | | | |
|---|---|---|---|
| 2011/0068359 A1* | 3/2011 | Yahata et al. | ................... 257/98 |
| 2011/0297983 A1* | 12/2011 | Nishiuchi et al. | ............... 257/98 |
| 2011/0297985 A1* | 12/2011 | Naka | ............................... 257/98 |

FOREIGN PATENT DOCUMENTS

| | | | | |
|---|---|---|---|---|
| JP | 11150298 A | * | 6/1999 | ...................... 257/98 |
| JP | 2005-019646 A | | 1/2005 | |

(Continued)

*Primary Examiner* — Evan Pert
*Assistant Examiner* — Changhyun Yi
(74) *Attorney, Agent, or Firm* — Global IP Counselors, LLP

(57) ABSTRACT

A semiconductor device has a light emitting element, and a resin layer; the light emitting element includes a semiconductor laminated body in which a first semiconductor layer and a second semiconductor layer are laminated in sequence, a second electrode connected to the second semiconductor layer on an upper surface of the second semiconductor layer that forms an upper surface of the semiconductor laminated body, and a first electrode connected to the first semiconductor layer on an upper surface of the first semiconductor layer in which a portion of the second semiconductor layer on one surface of the semiconductor laminated body is removed and a portion of the first semiconductor layer is exposed; and the resin layer is configured to cover at least a side surface of the light emitting element, and an upper surface of the resin layer is lower than the upper surface of the semiconductor laminated body.

11 Claims, 8 Drawing Sheets

(51) Int. Cl.
*H01L 33/46* (2010.01)

(52) U.S. Cl.
CPC .............. *H01L 33/54* (2013.01); *H01L 33/382* (2013.01); *H01L 33/46* (2013.01); *H01L 2924/12036* (2013.01); *H01L 2924/181* (2013.01)

(56) References Cited

FOREIGN PATENT DOCUMENTS

| | | |
|---|---|---|
| JP | 2011-066304 A | 3/2011 |
| JP | 2012-227470 A | 11/2012 |

\* cited by examiner

LIGHT EMITTING DEVICE INCLUDING LIGHT EMITTING ELEMENT, OUTER CONNECTION ELECTRODES AND RESIN LAYER

CROSS-REFERENCE TO RELATED APPLICATIONS

This application claims priority to Japanese Patent Application No. 2013-024746 filed on Feb. 12, 2013. The entire disclosure of Japanese Patent Application No. 2013-024746 is hereby incorporated herein by reference.

BACKGROUND

1. Technical Field

The disclosure relates to a light emitting device, and in particular to the electrode structure of a light emitting device.

2. Related Art

In recent years, various light emitting devices using a light emitting element that is enlarged to at least 1 mm×(0.5 to 1) mm have been developed in response to increasing developments of high-intensity brightness. A light emitting device using this type of light emitting element has a planar size that is equivalent to the light emitting element, is termed a chip size package (CSP), and is configured so that the electrodes that are used for mounting are disposed on the surface. The number that is provided on the package substrate in response to the required brightness can be easily adjusted, and the flexibility of design in relation to an illumination device or the like can be enhanced.

Of such devices, for a light emitting device that is used as an illumination light source, in order to form a light emitting device configured to emit a white mixed color light by combining fluorescent materials that are configured to emit lights of different wavelengths upon absorbing a portion of the light from the light emitting elements, it has been proposed to cover at least a portion of the light emitting elements, for example, the side surface and the surface on which an electrode is not formed, with a resin that contains fluorescent materials, or dispose a light shielding member on the side surface of the light emitting element (see JP2006-86191A and JP2012-227470A).

This type of light emitting device is configured to have a more simple structure by reducing the types of constituent members. However, self alignment problems have arisen in relation to CSP due to the type and condition of the mounting substrate provided for mounting the light emitting device or the type of the joint material that is joined to the electrode that is disposed on the CSP surface.

SUMMARY

The present invention is proposed in light of the above problems, and has the object of providing a light emitting device that enables effective prevention of self alignment problems resulting from a joint material between the mounting substrate and the CSP electrode or as a result of the type and condition of the mounting substrate.

The present invention provides a light emitting device comprising
a light emitting element,
a first outer connection electrode and a second outer connection electrode, and
a resin layer;
the light emitting element includes
a semiconductor laminated body in which a first semiconductor layer and a second semiconductor layer are laminated in sequence,
a second electrode connected to the second semiconductor layer on an upper surface of the second semiconductor layer that forms an upper surface of the semiconductor laminated body, and
a first electrode connected to the first semiconductor layer on an upper surface of the first semiconductor layer that is exposed by removal a portion of the second semiconductor layer on one surface of the semiconductor laminated body;
the first external connection electrode and the second external connection electrode are respectively connected to the first electrode and the second electrode of the light emitting element; and
the resin layer is configured to cover at least a side surface of the light emitting element, and
an upper surface of the resin layer is lower than the upper surface of the semiconductor laminated body.

With the light emitting device of the present invention, it is possible to effectively prevent self alignment problems resulting from a joint material between the mounting substrate and the CSP electrode or as a result of the type and condition of the mounting substrate.

DETAILED DESCRIPTION OF EXEMPLARY EMBODIMENTS

Figure 1A:
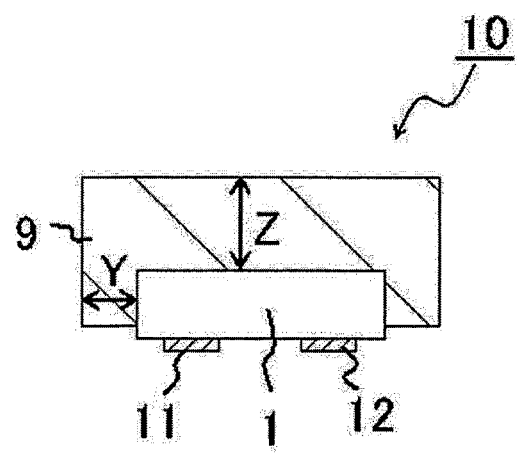
FIG. 1A is a schematic cross sectional view of a light emitting device according to a first embodiment of the present invention.

Embodiments for implementing the light emitting element of the present invention will be described below with reference to the accompanying drawings. The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted.

In the light emitting element or the light emitting device, "upper surface" means a surface which is formed a first electrode and a second electrode, or a first outer connection electrode and a second outer connection electrode, and "lower surface" means an opposing face of the upper face.

First Embodiment

As illustrated in FIG. 1A, the light emitting device 10 according to this embodiment includes a light emitting element 1, a first outer connection electrode 11 and a second outer connection electrode 12 that are respectively connected to a first electrode and a second electrode of the light emitting element 1 as described below, and a resin layer 9 that is configured to cover the lower surface and side surface of the light emitting element 1. The upper surface of the resin layer 9 is disposed at a position that is lower than the upper surface of a semiconductor laminated body.

The light emitting device normally has a planar configuration in the shape of a rectangle or substantially in the shape of a rectangle. As used herein, "substantially in the shape of a rectangle" means that a fluctuation is allowed in the angle of the four corners of 90±10 degrees.

[Light Emitting Element]

Figure 2A:
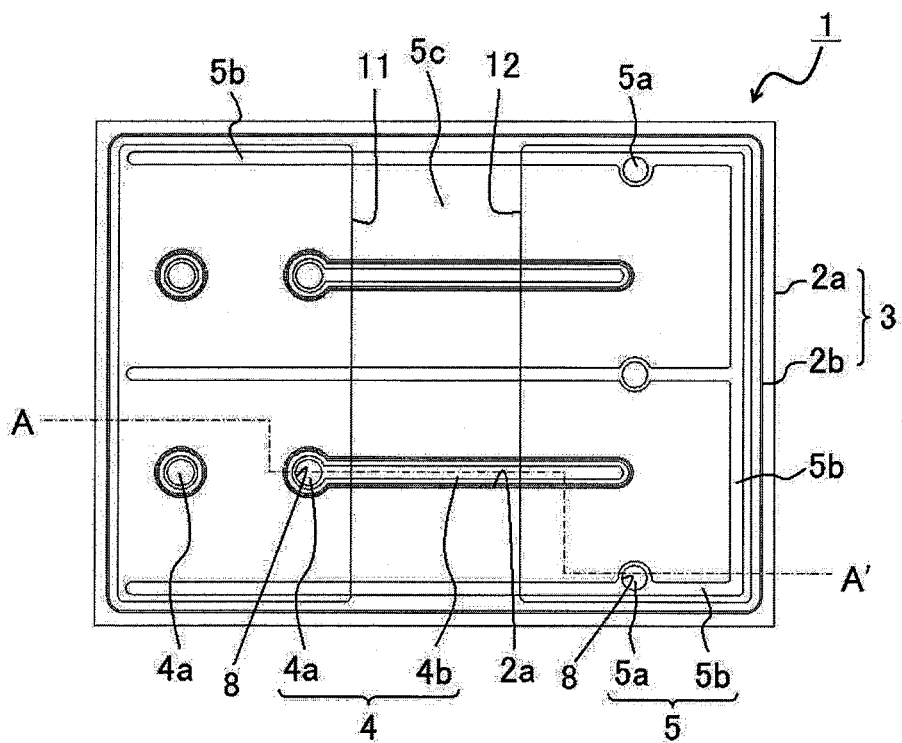
FIG. 2A is a schematic plan perspective view of a light emitting element in the light emitting device according to the first embodiment of the present invention.
Figure 2B:
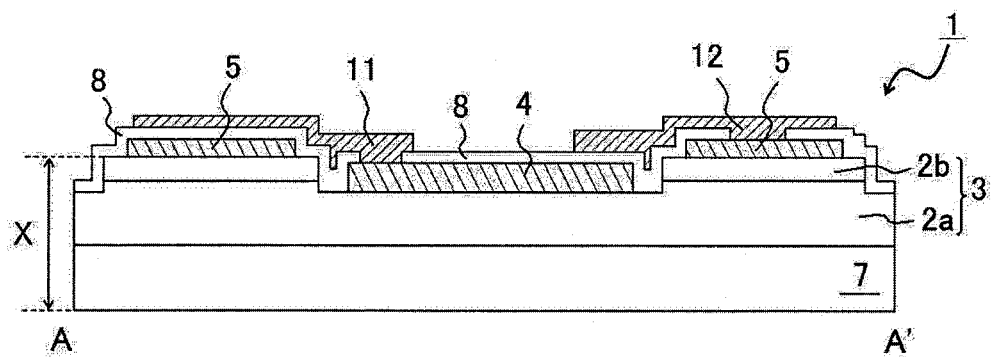
FIG. 2B is a sectional view along the line A-A' in FIG. 2A.

As illustrated in FIG. 2A and FIG. 2B, the light emitting element 1 has a semiconductor laminated body 3 in which a first semiconductor layer 2a and a second semiconductor layer 2b are laminated in sequence, a second electrode 5 that is connected to the second semiconductor layer 2b on the upper surface of the second semiconductor layer 2b that forms the upper surface of the semiconductor laminated body 3, and a first electrode 4 connected to the first semiconductor layer 2a on the upper surface of the first semiconductor layer 2a that is exposed by removal in a groove shape of a portion of the second semiconductor layer 2b on one surface of the semiconductor laminated body 3.

(Semiconductor Laminated Body)

The semiconductor laminated body is constituent members of the light emitting portion of the light emitting element, and may have any one of homo structure with MIS junction, PIN junction, PN junction or the like, hetero structure, or double-hetero structure. Of those structures, a structure having the first semiconductor layer 2a, the active layer, and the second layer 2b stacked in this order is preferably employed. An active layer which has a single quantum well structure or a multi-quantum well structure is formed to a thin film producing quantum effect. If the first conductivity type semiconductor layer is an n-type, the second conductivity type semiconductor layer may be a p-type, which can be vice versa. The kind and material of the semiconductor layers are not specifically limited, and for example, gallium nitride-based semiconductor materials such as $In_XAl_YGa_{1-X-Y}N$ ($0 \leq X$, $0 \leq Y$, $X+Y \leq 1$) can be preferably used.

(Substrate)

The semiconductor laminated body is normally deposited on a substrate 7. Examples of the material for the substrate include an insulating substrate such as sapphire ($Al_2O_3$) and spinel ($MgAl_2O_4$), silicone carbide (SiC), ZnS, ZnO, Si, GaAs, diamond, and an oxide substrate such as lithium niobate and neodymium gallate which are capable of forming a lattice matching with the nitride semiconductor.

Figure 7A:
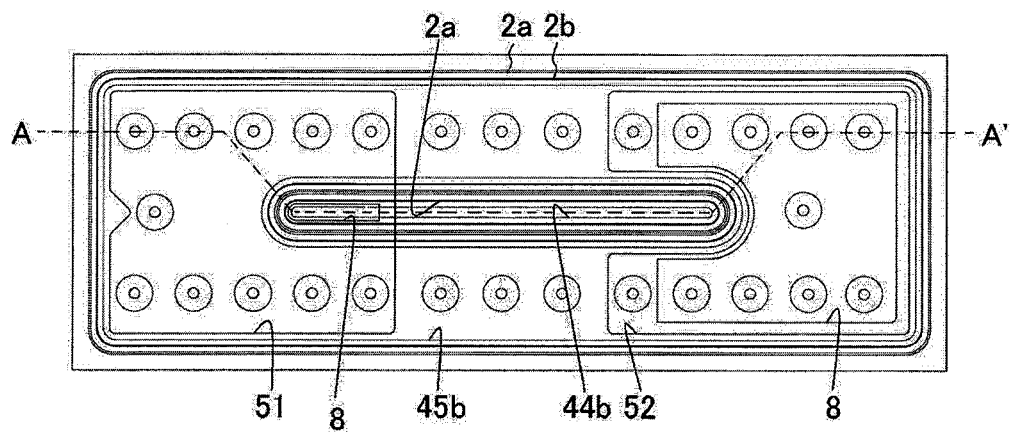
FIG. 7A is a schematic plan perspective view of the light emitting element in the light emitting device according to a fourth embodiment of the present invention.
Figure 7B:
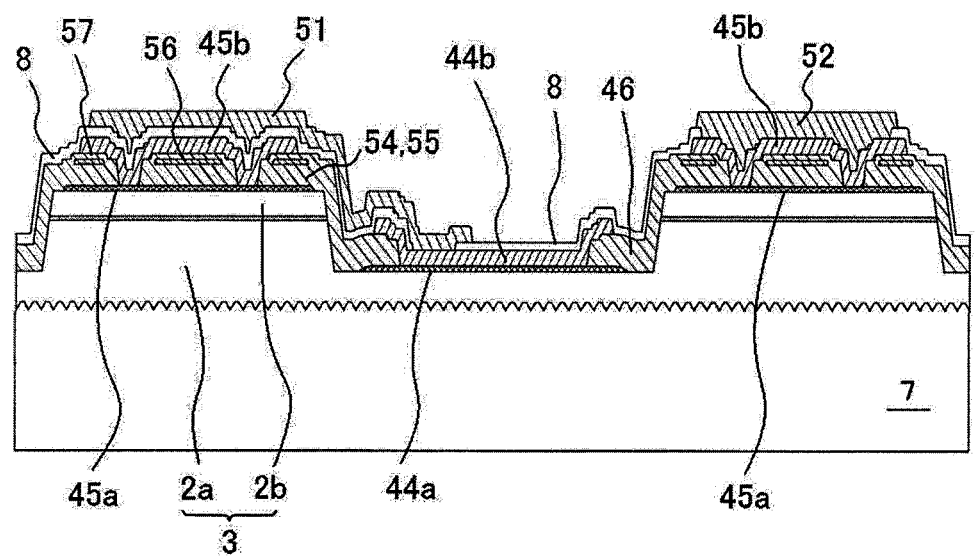
FIG. 7B is a sectional view along the line A-A' in FIG. 7A.

The substrate may have island patterned or stripe patterned concavity and convexity on its surface (see FIG. 7B).

(First Electrode and Second Electrode)

The first electrode 4 is connected to the exposed first semiconductor layer 2a on the upper surface of the first semiconductor layer 2a that is exposed by removal in a groove shape of a portion of the second semiconductor layer 2b on one surface of the semiconductor laminated body 3. As illustrated in FIG. 2A, the exposed first semiconductor layer 2a in a plane view is disposed on an inner side of the semiconductor laminated body 3, that is to say, the light emitting element, and the periphery thereof is enclosed by the semiconductor laminated body 3.

The second electrode 5 is connected to the second semiconductor layer 2b on the upper surface of the second semiconductor layer 2b that forms the upper surface of the semiconductor laminated body 3.

The first electrode 4 and the second electrode 5 may be configured as a single layer structure, or a laminated structure, and are preferably configured with an ohmic contact respectively to the first semiconductor layer 2a and the second semiconductor layer 2b. An ohmic contact is for example a connection to a semiconductor layer so that current and voltage characteristics are linear or substantially linear. Furthermore, it means that the voltage drop and the energy loss in the contact portion during device operation are so small that they can be ignored.

The first electrode 4 and the second electrode 5 can be formed of a single-layer or a multi-layer of oxide containing at least one selected from the group comprising of Zn, In, Sn, Mg, Cd, Ga Pb, and more specifically, conductive oxide such as ITO (Indium Tin Oxide; ITO), ZnO, $In_2O_3$, $SnO_2$, MgO, or metal or alloy of Ni, Rh, Cr, Au, W, Pt, Ti, Al.

In particular, for the first electrode 4, a multi-layer of Ti/Rh/Ti, Ti/Pt/Au, Ti/Rh/Au, or the like, respectively stacked in this order is preferably used.

For the second electrode 5, a multi-layer of Ti/Rh/Ti, Ti/Pt/Au, Ti/Rh/Au, or the like, respectively stacked in this order on part of an electrode 5c made from the conductive oxide which is formed on approximately entire surface of the second semiconductor layer.

There is no particular limitation on the shape of the first electrode 4 and the second electrode 5, and as illustrated in FIG. 2A, the shape includes a configuration that has connection portions 4a, 5a for connection with the outer electrode or the like, and extension portions 4b, 5b that extend from the connection portions 4a, 5a and narrow from the connection portions 4a, 5a in a plane view. The width, length, number and shape or the like of the extension portions may be suitably configured in response to the shape, characteristics or the like of the light emitting element.

[First Outer Connection Electrode and Second Outer Connection Electrode]

When mounting the light emitting element 1, the first outer connection electrode 11 and the second outer connection electrode 12 are configured as electrodes that form an electrical connection with the mounting substrate, and are electrically connected respectively to the first electrode 4 and the second electrode 5 of the light emitting element 1.

The first outer connection electrode 11 and the second outer connection electrode 12 may be configured to make contact and be electrically connected with the whole surface of the first electrode 4 and the second electrode 5. However, normally, a part thereof is electrically connected with the first electrode 4 and the second electrode 5 through an interlayer insulation layer 8. Furthermore, the first outer connection electrode 11 covers a portion of the second electrode 5 through the interlayer insulation layer 8 and the second outer connection electrode 12 covers a portion of the first electrode 4 through the interlayer insulation layer 8.

In this manner, the mounting surface of the first outer connection electrode 11 and the second outer connection electrode 12 is planar or substantially planar, or in other words, flat or substantially flat. As used herein, "substantially" means that an unevenness or a difference in elevation is allowable to the degree that the light emitting element can be mounted in a horizontal configuration on the mounting substrate as a result of a fluctuation in the thickness of the joint material (for example, solder or the like) that is used for mounting onto the mounting substrate.

The first outer connection electrode 11 and the second outer connection electrode 12 can be formed by use of the same material as the material used to configure the first electrode 4 and the second electrode 5 as described above. For example, the first outer connection electrode 11 and the second outer connection electrode 12 may be formed by a laminated film formed by laminating Ti, Pt and Au films, or Ti, Ni and Au films in sequence from the semiconductor layer.

The first outer connection electrode 11 and the second outer connection electrode 12 may occupy different surface areas on the lower surface of the light emitting device, or may be configured with the same surface area or substantially the same surface area. When configured with the same surface area or substantially the same surface area, it is preferred that the surface area of one of the outer connection electrodes is within ±10% of the surface area of the other outer connection electrode.

[Interlayer Insulation Layer]

The interlayer insulation layer 8 interposed between the first electrode 4 and the second electrode 5 and the first outer connection electrode 11 and the second outer connection electrode 12 may be formed by an insulating film, that includes for example an oxide film, a nitride film, or an oxide nitride film. Of these films, a single layer or laminated film of $Nb_2O_5$, $TiO_2$, $SiO_2$, $Al_2O_3$, $ZrO_2$ or the like can be formed, or a distributed Bragg reflector (DBR) can be formed as described below. This type of interlayer insulation layer 8 can be formed by a known method, for example, such as a sputtering method, ECR sputtering method, CVD method, ECR-CVD method, ECR-plasma CVD method, vapor deposition method, EB method or the like.

The interlayer insulation layer 8 normally includes through-holes that is disposed on the first electrode 4 and the second electrode 5. The through-holes enable the first outer connection electrode 11 and the second outer connection electrode 12 to be connected respectively to the first electrode 4 and the second electrode 5.

In particular, the interlayer insulating layer 8 enables the first outer connection electrode 11 and the second outer connection electrode 12 to be respectively disposed to cover the area above the second semiconductor layer 2b from the area above the first semiconductor layer 2a that is exposed in the shape of a groove, and as described above, enables the mounting surface thereof is formed in a planar or flat configuration.

[Resin Layer]

The upper surface of the resin layer 9 is disposed at a position that is lower than the upper surface of the semiconductor laminated body 3 of the light emitting element 1. When there is a difference in elevation in the upper surface of the semiconductor laminated body 3, the upper surface of the resin layer 9 is disposed at a position that is lower than the surface at the highest position, that is to say, than the upper surface of the second semiconductor layer 2b.

The low upper surface of the resin layer 9 may extend with a fixed height across the whole surface, or may have localized height differences.

The upper surface of the resin layer 9 may be disposed more on the lower side than the upper surface of the semiconductor laminated body 3 at a length that is less than or equal to the length that corresponds to the height of the light emitting element 1 itself. Alternatively, since the semiconductor laminated body 3 is normally laminated on the substrate 7, in that configuration, disposition is possible more on the lower side than the upper surface of the semiconductor laminated body 3 at a length that is less than or equal to the total thickness of the semiconductor laminated body 3 and the substrate 7. In FIG. 2B, the upper surface of the resin layer 9 may be disposed in the range denoted by the arrow X. In particular, it is preferred that the upper surface of the resin layer 9 is disposed to be lower than the upper surface of the semiconductor laminated body 3 by several microns to several tens of microns.

The width (thickness, Y in FIG. 1A) on the side surface of the light emitting element of the resin layer 9 is for example 10 microns to 2 millimeters, several tens of microns to 1 mm, or several tens to several hundreds of microns.

In this manner, leakage of light from the side surface of the semiconductor laminated body can be inhibited by a lower disposition of the upper surface of the resin layer 9, and it is possible to prevent a reduction in the light extraction efficiency, or the production of irregular coloration. Furthermore, even when there is warpage and undulation in the mounting substrate that mounts the light emitting device, the resin layer of the light emitting device does not make contact or become stuck on the mounting layer, and it is always possible to dispose the light emitting device at a suitable position. Furthermore, it is not to inhibit upward creep or loosening of the joint material that mounts the light emitting device on the mounting substrate, and therefore the joint material can always be disposed at a suitable position and amount. As a result, alignment deviations in the light emitting device can be avoided, and the self alignment effect can be ensure to thereby enable mounting of the light emitting device at an appropriate position.

Figure 1B:
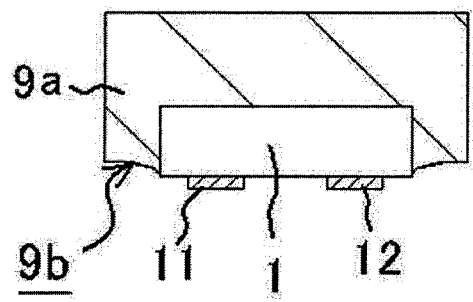
FIG. 1B is a schematic cross sectional view of another light emitting device according to the first embodiment of the present invention.

The resin layer 9 may expose a part of the side surface of the semiconductor laminated body 3 (reference is made to FIG. 1A), or although the side surface of the semiconductor laminated body 3 is covered, the upper surface 9b of the resin layer 9a may become gradually lower in accordance with separation from the semiconductor laminated body 3 (reference is made to FIG. 1B).

The resin used to configure the resin layer may be a resin that is used in this technical field for sealing members or translucent members. The resin includes a resin that has translucent properties, light shielding properties or reflective properties. For example, the resin includes use of a thermoplastic resin such as a polyamide resin, a polyphthalamide, a silicon resin with high light resistance, and an epoxy resin, or the like.

White pigment, a fluorescent material, a filler, a diffusing agent, or the like may be included in the resin layer. Examples of the fluorescent material, the filler and the diffusing agent include these described in JP2006-86191A. The contained amount of the fluorescent material, the filler, the diffusing agent, or the like may be suitably adjusted. It is preferred that of those substances, the resin layer is a layer that contains a fluorescent material or a filler. The contained amount may be suitable adjusted in response to the intended properties.

The resin layer may at least cover the side surface of the light emitting element, and furthermore may cover the lower surface of the light emitting element (reference is made to FIG. 1A). When the resin layer covers the lower surface of the light emitting element, the thickness Z of the resin layer at the lower surface is for example of 10 microns to several millimeters, several tens of microns to 1 mm, or several tens to several hundreds of microns.

The resin layer 9 may be formed by screen printing, inkjet coating, potting, stencil printing, extrusion molding, or the like. Alternatively, the resin layer 9 may be formed in a manner such that a separate processing step may be used to include a fluorescent material in a translucent resin, glass or the like, and, for example, the resin layer can be formed by extrusion molding or the like to thereby enable formation of the resulting resin layer by engagement with light emitting element. Use of this type of method enables formation of the resin layer with a uniform thickness on the lower surface or the periphery of the light emitting element.

Figure 3:
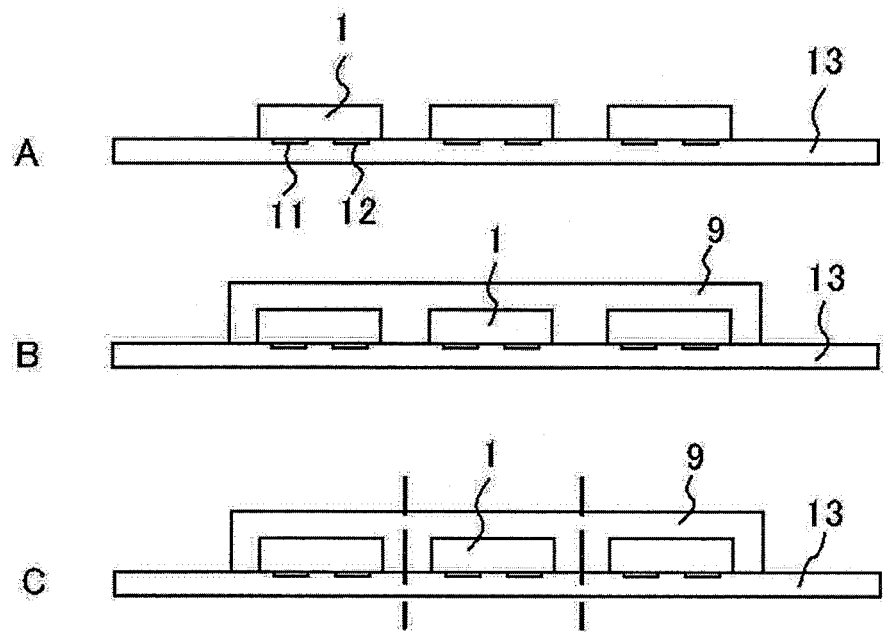
FIG. 3 is a schematic sectional manufacturing process view illustrating a method of manufacturing the light emitting device according to the first embodiment of the present invention.

More specifically, firstly as illustrated in FIG. 3A, a light emitting element 1 is adhered to an adhesive sheet 13, here the light emitting element includes the first outer connection electrode 11 and the second outer connection electrode 12 that are respectively connected to the first electrode 4 and the second electrode 5 of the light emitting element 1. At that time, it is preferred that the adhesive sheet 13 is adhered so that the first outer connection electrode 11 and the second outer connection electrode 12 are embedded into the adhesive sheet 13, and the upper surface of the light emitting element 1 is pressed into the adhesive sheet 13. Furthermore, it is preferred that a plurality of light emitting elements 1 adhered at an equal interval to the adhesive sheet 13.

Next, the light emitting element 1 and the adhesive sheet 13 are sandwiched by molds, and a resin material is extruded into the molds to thereby dispose the resin material on the periphery of the light emitting element 1, and thereafter, the resin material is cured and extracted from the molds (reference is made to FIG. 3B).

As illustrated in FIG. 3C, the resin layer 9 is cut at each light emitting element 1, and the adhesive sheet 13 is peeled away.

Alternatively, in the same manner as described above, firstly the light emitting element is adhered to the adhesive sheet.

Then, screen printing or the like is used to introduce resin material between the light emitting elements by coating the resin material from the lower surface side of the light emitting elements.

Then the resin material is cured, the resin layer is cut at each light emitting element, and the adhesive sheet is peeled away.

This type of manufacturing method configures the light emitting device with the upper surface of the resin layer disposed at a position that is lower than the upper surface of the semiconductor laminated body of the light emitting element by pressing and embedding into the adhesive sheet.

Second Embodiment

Figure 4A:
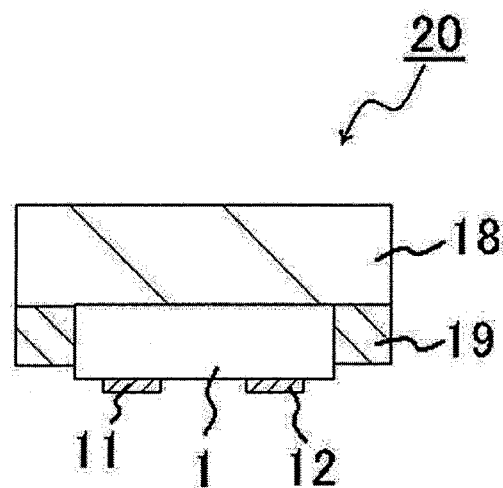
FIG. 4A is a schematic cross sectional view of the light emitting device according to a second embodiment of the present invention.

As illustrated in FIG. 4A, the light emitting device 20 according to this embodiment includes a second resin layer 18 that contains a fluorescent material on the lower surface of the of the light emitting element 1 in addition to the resin layer 19 on the side surface of the light emitting element 1, and in other respects has the substantially the same configuration as the light emitting device 10 according to the first embodiment.

Figure 4B:
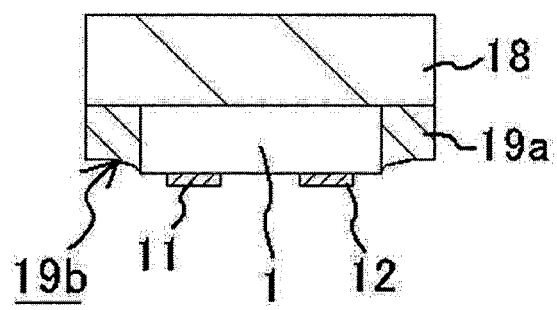
FIG. 4B is a schematic cross sectional view of another light emitting device according to the second embodiment of the present invention.

The resin layer 19 may expose a portion of the side surface of the semiconductor laminated body 3 (reference is made to FIG. 4A), or although the side surface of the semiconductor laminated body 3 is covered, the upper surface 19b of the resin layer 19a may become gradually lower in accordance with separation from the semiconductor laminated body 3 (reference is made to FIG. 4B).

The resin layer 19 and the second resin layer 18 may be formed by the following method.

Figure 5:
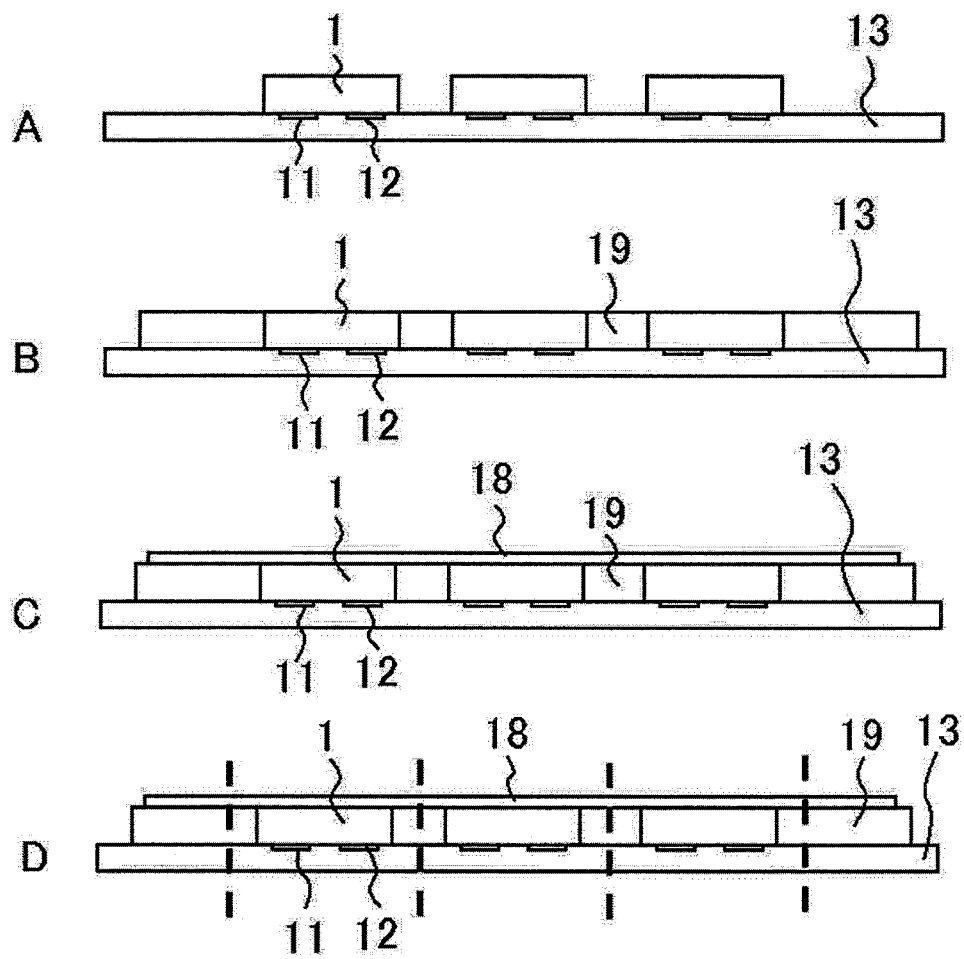
FIG. 5 is a schematic sectional manufacturing process view illustrating a method of manufacturing the light emitting device according to the second embodiment of the present invention.

As illustrated in FIG. 5A, the light emitting element 1 is adhere to the adhesive sheet 13, here, the light emitting element 1 includes the first outer connection electrode 11 and the second outer connection electrode 12 that are respectively connected to the first electrode 4 and the second electrode 5 of the light emitting element 1. At that time, it is preferred that the adhesive sheet 13 is adhered so that the first outer connection electrode 11 and the second outer connection electrode 12 are embedded into the adhesive sheet 13, and the upper surface of the light emitting element 1 is pressed into the adhesive sheet 13. Furthermore, it is preferred that a plurality of light emitting elements 1 adhered at an equal interval to the adhesive sheet 13.

Then, as illustrated in FIG. 5B, screen printing or the like is used to introduce resin material between the light emitting elements by coating the resin material from the lower surface side of the light emitting elements. Then the resin material is cured to form the resin layer 19.

Then as illustrated in FIG. 5C, a sheet that is formed from the second resin material that contains a fluorescent material is adhered to the lower surface side of the light emitting element 1.

Thereafter, as illustrated in FIG. 5D, the second resin layer 18 and the resin layer 19 are cut at each light emitting element, and the adhesive sheet is peeled away.

This type of manufacturing method configures the light emitting device with the upper surface of the resin layer disposed at a position that is lower than the upper surface of the semiconductor laminated body of the light emitting element by pressing and embedding into the adhesive sheet.

Third Embodiment

Figure 6A:
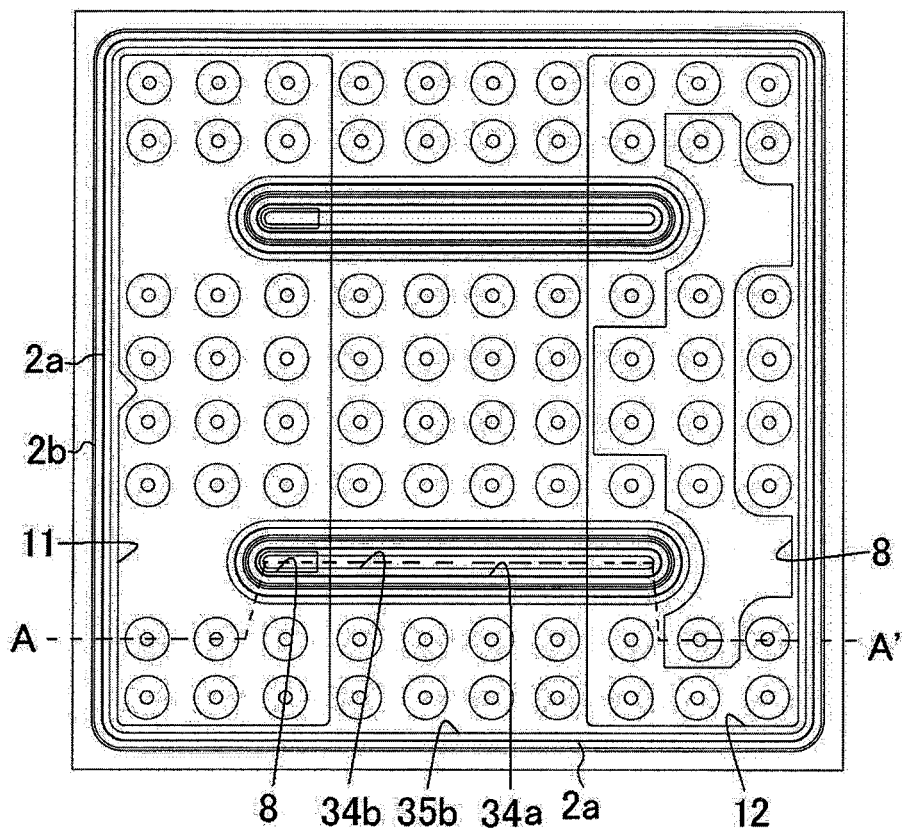
FIG. 6A is a schematic plan perspective view of the light emitting element in the light emitting device according to a third embodiment of the present invention.
Figure 6B:
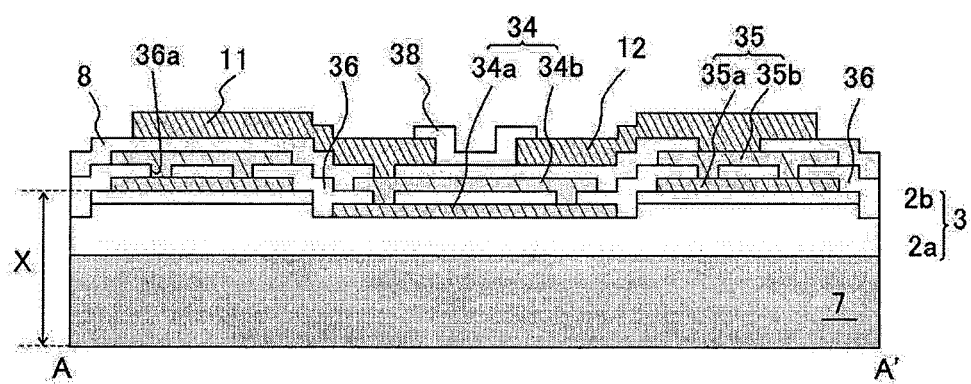
FIG. 6B is a sectional view along the line A-A' in FIG. 6A.

As illustrated in FIG. 6A and FIG. 6B, the light emitting device according to the present embodiment has a different structure in relation to the first electrode 34 and the second electrode 35 of the light emitting element as described below, and in other respects has the substantially the same configuration as the light emitting device 10 according to the first embodiment.

An insulating film 38 may be disposed between the first outer electrode 11 and the second outer electrode 12 on the lower surface of the light emitting device. The disposition of the insulating film 38 enables prevention of an electrical connection between those two electrodes. Furthermore, a short circuit connection can be prevented in relation to both outer electrodes of the joint material during mounting operations.

(First Electrode and Second Electrode)

The first electrode 34 and the second electrode 35 of the light emitting device 31 includes a first ohmic electrode 34a and a second ohmic electrode 35a that are respectively in contact with the first semiconductor layer 2a and the second semiconductor layer 2b, and a first electrode layer 34b and a second electrode layer 35b that are respectively connected to at least a portion of the first ohmic electrode 34a and the second ohmic electrode 35a. Alternatively, either one of the ohmic electrode or the electrode layer may be provided in contact with the first semiconductor layer and the second semiconductor layer.

It is preferred that the ohmic electrodes are normally disposed on substantially the whole surface of the first semiconductor layer 2a and the second semiconductor layer 2b so that current supplied from the first electrode 34 and the second electrode 35 undergoes uniform flow on the whole surface of the respective semiconductor layers. Furthermore, it is preferred that the ohmic electrode is formed from a translucent conductive film in order to efficiently extract light from the semiconductor laminated body (that is to say, the active layer). As used herein, "translucent" means a property under which at least 50%, at least 60%, at least 70%, at least 80% of the light emitted from the active layer is transmitted, and for example, includes a single layer film or laminated film of the conductive oxide film described above. When in a translucent configuration, a single layer film or laminated film of thin-film metal or alloy that is generally used in electrodes may be employed. Of such configurations, ITO is preferred in view of conductive and translucent properties.

The first ohmic electrode 34a and the second ohmic electrode 35a may be formed from the same material, or formed from different materials.

The electrode layer is an electrode configured to supply current to the ohmic electrode, and for example is formed from a single layer film or laminated film of a metal or alloy of Ni, Rh, Cr, Au, W, Pt, Ti, Al, Ru or the like. Of such materials, laminated film in which Ti/Rh/Ti, Ti/Pt/Au, Ti/Rh/Au or the like are formed in this order is preferred.

There is no particular limitation in relation to the shape of the electrode layer, and it may be configured with the same shape and size as the ohmic electrode, or may be of a shape that is slightly smaller than the ohmic electrode.

As illustrated in FIG. 6B, for example, the insulating layer 36 including through-holes 36a is disposed on the first ohmic electrode 34a and the second ohmic electrode 35a, and the first electrode layer 34b or the second electrode layer 35b is disposed on the insulating layer 36 to thereby connect the first electrode layer 34b or the second electrode layer 35b through the through-holes 36a with the first ohmic electrode 34a or the second ohmic electrode 35a.

(Insulating Layer)

The insulating layer 36 is a layer configured to insulate the ohmic electrode and the electrode layer, and may be configured with either a single layer structure or a laminated structure.

The insulating layer 36 may be formed as either a single film or a laminated film by use of the same material as the interlayer insulating film described above, and furthermore a configuration as a distributed Bragg reflector (DBR) as described below is preferred.

The planar shape of the through-holes 36a formed in the insulating layer 36 may be configured as a circle, an oval, a polygon, or the like, and there is no limitation on the number or disposition. However, as illustrated in FIG. 6A, an example includes a disposition of 8 rows and 10 columns. Alternatively, the through-holes may have a random disposition. The average diameter of the through-holes 36a is of about 5 microns to 15 microns. The planar shape of the through-holes 36a may be calculated as the average value of the long radius and the short radius when configured as an oval, and when configured as a square may be calculated as the diameter of a circle that has the same surface area as the surface area of the square. The interval between the through-holes 36a is preferably for example about 2 to 8 times the average diameter of the through-holes.

Fourth Embodiment

As illustrated in FIG. 7A and FIG. 7B, the light emitting device according to the present embodiment is substantially the same as the light emitting device 10 according to the first embodiment and the light emitting device 10 according to the third embodiment but differs in relation to the disposition of the through-holes and the structure of the insulating layer that is disposed between the first electrode layer 44b and the second electrode layer 45b and the first ohmic electrode 44a and the second ohmic electrode 45a that configure the first electrode 44 and the second electrode 45, and the difference in relation to the number of the first electrodes 44.

(Insulating Layer)

The insulating layer 46 that is disposed between the first electrode layer 44b and the second electrode layer 45b and the first ohmic electrode 44a and the second ohmic electrode 45a that configure the first electrode 44 and the second electrode 45 is a laminated layer having a laminated structure, and a conductive film that is provided therein is disposed in an insulated configuration so as to prevent an effect on the connection between the ohmic electrode and the electrode layer.

This type of insulating layer 46 for example includes a configuration in which a base layer 54, a distributed Bragg reflector (DBR) 55, a metal film 56, and a cap layer 57 are laminated in sequence from the ohmic electrode side.

The base layer 54 is a layer that forms the base for the DBR 55, and the base layer 54 is preferably formed from an insulating film, and in particular from an oxide film as described above.

Figure 7C:
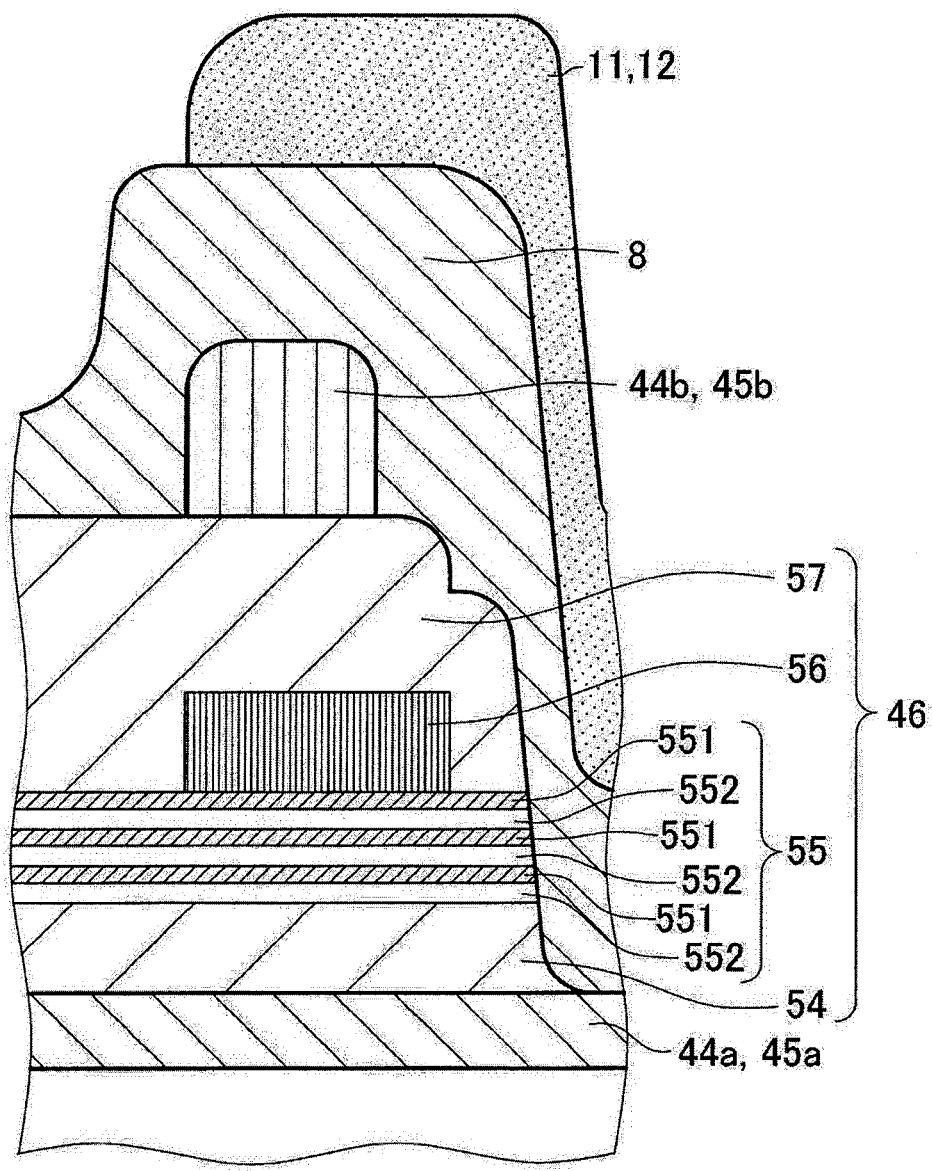
FIG. 7C is a partial enlargement of FIG. 7B.

The DBR 55 as illustrated in FIG. 7C is configured with a multilayered structure of a plurality of one set, here, one set is formed by laminating dielectric materials formed from a low refractive index layer 551 and a high refractive index layer 552, and selectively reflects light of a predetermined wavelength. More specifically, films having a different refractive index are alternately laminated at an optical thickness of ¼ of the wavelength to thereby enable high efficiency reflection of a predetermined wavelength. The material film is preferably selected from at least a type of oxide or nitride selected from the group comprising Si, Ti, Zr, Nb, Ta, and Al.

When the DBR 55 is formed from an oxide film, the low refractive index layer 551 is formed for example from $SiO_2$. In this configuration, the high refractive index layer 552 is formed for example from $Nb_2O_5$, $TiO_2$, $ZrO_2$, $Ta_2O_5$, or the like. The DBR 55 is configured in sequence from the side with the base layer 54 from $(Nb_2O_5/SiO_2)_n$, where n is a natural number. The natural number n is preferably between 2 and 5, and more preferably 3 to 4. The total film thickness of the DBR 55 is preferably 0.2 to 1 microns, and more preferably 0.3 to 0.6 microns.

The metal film 56 is contained in the insulating layer 46 and is premised on the feature that current does not flow therein. The metal film 56 for example is formed as a single layer or a laminated structure by use of a highly reflective metal such as Al, Ag, or the like, or an alloy thereof. When configured only using Al, configuration as a high output element is possible. When configured as an Al alloy, an alloy with a Cu, Ag, and metal of the platinum group such as Pt or the like for example may be used. Of such configurations, an alloy of Al and Cu (AlCu) may inhibit migration of Al, and enables a configuration of a high reliable element.

When the metal film 56 is configured with a laminated structure, it is preferred that a structure is included in which a material that has a corrosion prevention effect in relation to Al and Ag or a adhesion effect with the cap layer 57 described below is provided on the metal or alloy that exhibits high reflectivity such as Al, Ag, or the like. For example, the structure includes a bilayer structure of Al alloy/Ti or a trilayer structure of Al alloy/$SiO_2$/Ti.

The metal film 56 is formed on the DBR 55, and therefore enables reflection of light that has passed from the semiconductor layer body 3 through the DBR 55. The DBR 55 has the advantage of exhibiting low loss due to reflection since the light at a predetermined angle of incidence is completely reflected. However, there is the disadvantage that there is a reduction in the reflectivity when the angle of incidence of the light is large. On the other hand, the metal film 56 exhibits the advantage that the range of the angle of incidence that enables reflection of light is large, and the wavelength range of light that can be reflected is large. The incident light can be efficiently reflected by combination of this type of DBR 55 with the metal film 56.

The cap layer 57 is a layer that is configured to cover and protect the metal film 56. The cap layer 57 in the same manner as the base layer 54 is formed from an oxide film such as $SiO_2$ or the like. The material used in the cap layer 57 may be the same as the material used in the base layer 54, or may be different.

The light emitting device according to the present invention can be used for various kinds of light emitting devices, in particular, illumination light sources, LED displays, back light sources for liquid crystal displays, light sources for signals, illumination type switches, various kinds of sensors and indicators auxiliary light sources for animated illumination, and sources for other common consumer products.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a light emitting element;
   a first outer connection electrode and a second outer connection electrode; and
   a resin layer, wherein
   the light emitting element includes
      a substrate,
      a semiconductor laminated body in which a first semiconductor layer and a second semiconductor layer are laminated on the substrate in sequence from a first side to a second side of the light emitting device,
      a second electrode connected to the second semiconductor layer on a surface of the second semiconductor layer on the second side, and
      a first electrode connected to the first semiconductor layer on a surface of the first semiconductor layer on the second side, the surface of the first semiconductor layer being exposed by removal of a portion of the second semiconductor layer of the semiconductor laminated body from the second side,
   the first outer connection electrode and the second outer connection electrode are respectively connected to the first electrode and the second electrode of the light emitting element,
   the resin layer covers at least a part of a side surface of the light emitting element so as to cover at least a part of a side surface of the substrate and a side surface of the semiconductor laminated body, and
   a position of a surface of the resin layer farthest to the second side is disposed closer to the first side than a position of a surface of the semiconductor laminated body farthest to the second side.

2. The light emitting device of according to claim 1, wherein
   the resin layer is a layer which includes a fluorescent material or a filler.

3. The light emitting device of according to claim 1, wherein
   the resin layer exposes a portion of a side surface of the semiconductor laminated body.

4. The light emitting device of according to claim 1, wherein
   mounting surfaces of the first outer connection electrode and the second outer connection electrode share a same plane or an approximately same plane.

5. The light emitting device of according to claim 1, wherein
   the first electrode includes a first ohmic electrode that is in contact with the first semiconductor layer, and a first electrode layer that is connected to at least a portion of the first ohmic electrode, and
   the second electrode includes a second ohmic electrode that is in contact with the second semiconductor layer, and a second electrode layer that is connected to at least a portion of the second ohmic electrode.

6. The light emitting device of according to claim 5, further comprising
   an insulating film that includes through-holes and is disposed on the first ohmic electrode and the second ohmic electrode, and
   the first electrode layer and the second electrode layer are respectively connect with the first ohmic electrode and the second ohmic electrode through the through-holes.

7. The light emitting device of according to claim 5, further comprising
   an interlayer insulating film that includes through-holes and is disposed on the first electrode layer and the second electrode layer, and
   the first outer connection electrode and the second connection electrode are respectively connect with the first electrode layer and the second electrode layer through the through-holes.

8. The light emitting device of according to claim 5, wherein
   the first electrode layer and the second electrode layer respectively have a connection portion, and
   an extension portion that extends from the connection portion and narrows from the connection portion in a plane view.

9. The light emitting device of according to claim 1, wherein
   the first electrode and the exposed first semiconductor layer are disposed on an inner side of the semiconductor laminated body in a plane view.

10. The light emitting device of according to claim 1, wherein
    the first outer connection electrode and the second outer connection electrode are respectively disposed to cover an area above the second semiconductor layer from an area above the first semiconductor layer.

11. The light emitting device of according to claim 1, further comprising
    a second resin layer that contains a fluorescent material on a surface of the light emitting element on the first side.

* * * * *